(12) United States Patent
Jain et al.

(10) Patent No.: US 12,322,474 B2
(45) Date of Patent: Jun. 3, 2025

(54) MEMORY DEVICE, READ CLOCK GENERATION CIRCUIT, AND METHOD FOR CONTROLLING READ OPERATION IN MEMORY DEVICE

(71) Applicant: TAIWAN SEMICONDUCTOR MANUFACTURING COMPANY LTD., Hsinchu (TW)

(72) Inventors: Sanjeev Kumar Jain, Kanata (CA); Atul Katoch, Kanata (CA)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 147 days.

(21) Appl. No.: 18/297,094

(22) Filed: Apr. 7, 2023

(65) Prior Publication Data
US 2024/0339140 A1  Oct. 10, 2024

(51) Int. Cl.
  *G11C 7/22*   (2006.01)
  *G11C 7/08*   (2006.01)
  *G11C 7/12*   (2006.01)

(52) U.S. Cl.
  CPC .............. *G11C 7/222* (2013.01); *G11C 7/08* (2013.01); *G11C 7/12* (2013.01)

(58) Field of Classification Search
  CPC .............. G11C 7/222; G11C 7/08; G11C 7/12
  USPC ...................................................... 365/233.1
  See application file for complete search history.

(56) References Cited

U.S. PATENT DOCUMENTS

| 2009/0185430 A1* | 7/2009 | Wilson | G11C 7/1066 |
| | | | 365/189.05 |
| 2010/0142286 A1* | 6/2010 | Hwang | G11C 7/12 |
| | | | 365/189.11 |
| 2010/0246281 A1* | 9/2010 | Wilson | G11C 7/1051 |
| | | | 365/207 |

FOREIGN PATENT DOCUMENTS

CN     114094997 A  *  2/2022  ............ H03K 5/1565

\* cited by examiner

*Primary Examiner* — Fernando Hidalgo
(74) *Attorney, Agent, or Firm* — WPAT LAW; Anthony King

(57) ABSTRACT

The present disclosure provides a memory device, which includes a memory array, a read-clock generation circuit, and a local input/output circuit. The read-clock generation circuit receives a sense amplifier enable signal, a first sense amplifier pre-charge signal, and a latched write enable signal to generate a first read enable signal. The local input/output circuit includes multiple pairs of column-address pass gates, and a pair of read pass gates. The plurality of pairs of column-address pass gates are configured to receive data from a bit-line pair of the memory cells in a row selected by an address signal. The pair of read pass gates connects a read bit-line pair to the bit-line pair in response to the first read enable signal being in a low-logic state. The first read enable signal is de-asserted after the read bit-line pair connected to the pair of read pass gates are pre-charged.

20 Claims, 13 Drawing Sheets

MEMORY DEVICE, READ CLOCK GENERATION CIRCUIT, AND METHOD FOR CONTROLLING READ OPERATION IN MEMORY DEVICE

BACKGROUND

The present disclosure relates to memory devices, and, in particular, to a memory device, a read clock generation circuit, and a method for controlling a read operation in a memory device.

For GPUs (graphics processing units), high-speed memory is required to operate at the speed of the CPU (central processing unit). The speed (i.e., cycle time) of the memory is limited by many paths in the memory, such as a bit-line pre-charge path, a word-line path, a read-clock path, a write-clock path, a sense-amplifier pre-charge path.

Since the race condition between the read clock and internal nodes of the sense amplifier of the SRAM often occurs, it is difficult to prevent the internal nodes of the sense amplifier from being pre-charged at the end of each clock cycle in an existing SRAM, resulting in lower speed of the existing SRAM.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1:
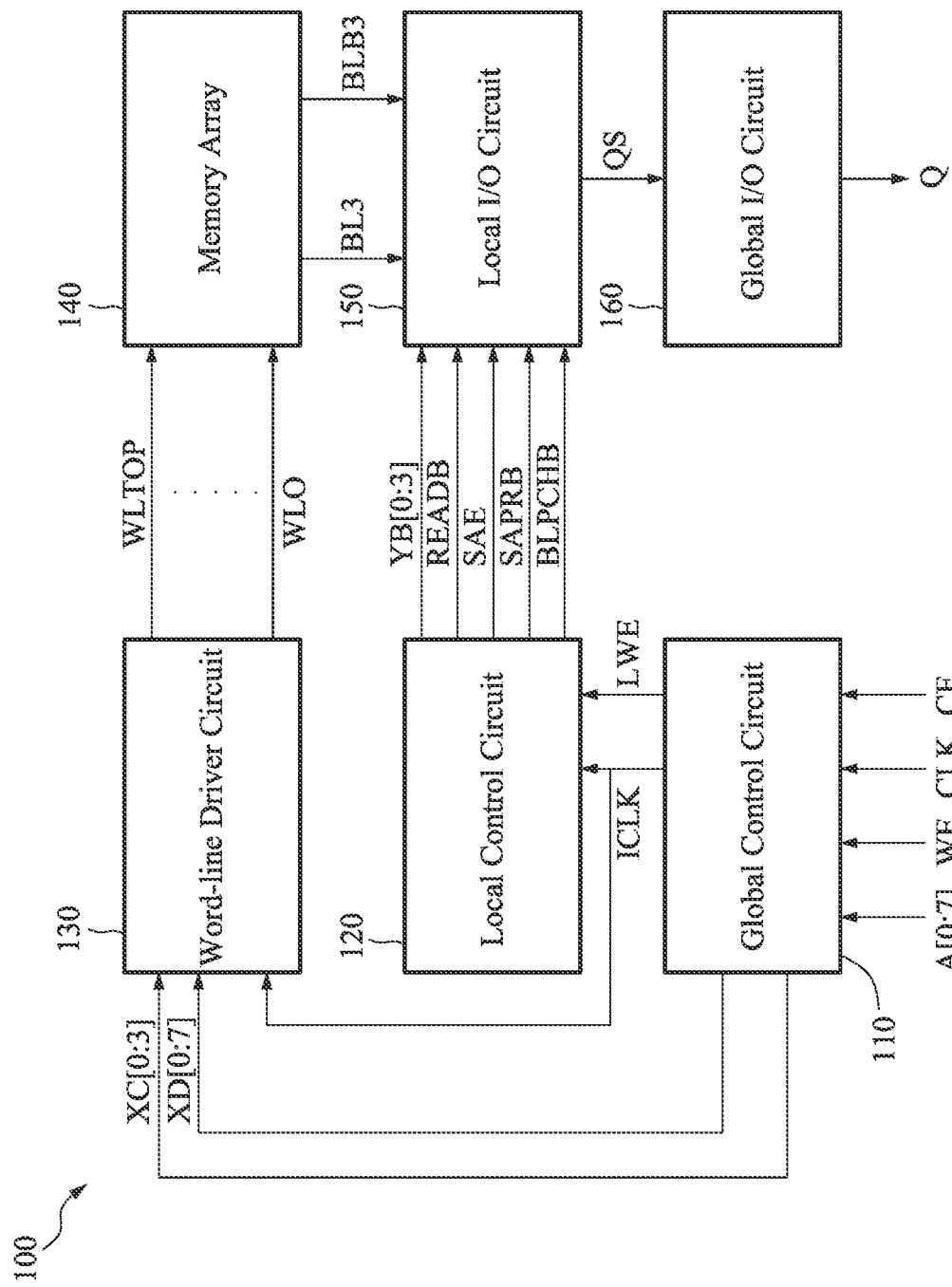
FIG. 1 is a block diagram of a memory device in accordance with an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram of a memory device 100 in accordance with an embodiment of the disclosure.

In an embodiment, the memory device 100 can be a random access memory, such as a static random access memory (SRAM) device. As shown in FIG. 1, the memory device 100 may include a global control circuit 110, a local control circuit 120, a word-line driver circuit 130, a memory array 140, a local I/O (input/output) circuit 150, and a global I/O circuit 160. The memory device 100 may include other components not shown in FIG. 1. In some embodiments, the memory device 100 can be part of an integrated circuit (IC) chip.

The memory array 140 may include a plurality of memory cells (also referred to as bit cells) arranged in a two-dimensional matrix of rows and columns. Each of the memory cells of the memory array 140 is configured to store one bit of information such as '0' or '1'. In some implementations, each memory cell uses six transistors (6T) connected between an upper reference voltage and a lower reference voltage (e.g., ground) such that one of two storage nodes can be occupied by the information to be stored, with the complementary information stored at the other storage node.

The memory array 140 includes a plurality of word lines and a plurality of bit-line pairs. Each memory cell of the memory array 140 is connected to a word line and a bit-line pair. A word line is operative to activate access to the memory cells of a row connected to the word line. The bit-line pair is used to access information stored or to be stored in the memory cells activated by the word line.

The peripheral circuits of the memory device 100, such as the global control circuit 110, the local control circuit 120, the word-line driver circuit 130, the local I/O circuit 150, and the global I/O circuit 160, can provide various functions of the memory device 100 associated with the memory array 140. For example, the word-line driver circuit 130 may be configured to select a word line (e.g., one of word lines WL0 to WLTOP) of the memory array 140 and charge the selected word line to a high-logic state. The high-logic state (e.g., '1') is approximately equal to a first predefined voltage. In some embodiments, the word-line driver circuit 130 may be controlled by address lines XC[0:3] and XD[0:7] that are charged to the high-logic state (e.g., approximately equal to the first voltage) or a low-logic state (e.g., approximately equal to a second voltage). For example, the first voltage can be approximately equal to the power supply voltage of the memory device 100, and the second voltage is approximately equal to the ground voltage (e.g., 0V). In addition, the high-logic state is represented by bit 1 and the low-logic state is represented by bit 0.

The local I/O circuit 150 may be configured to read and write data from and into the memory array 140. The local control circuit 120 may be configured to control the local I/O circuit 150. For example, the local control circuit 120 may configure the local I/O circuit 150 in a read mode to read information from the memory array 140 or in a write mode to write information to the memory array 140. In addition, the local control circuit 120 may be further configured to set the local I/O circuit 150 in a hold mode where no data is read from or written to the memory 140.

For example, the memory array 110 can include a plurality of word lines and a plurality of bit-line pairs. Each memory cell of the memory array 110 is connected to a word line and a bit-line pair. A word line is operative to activate access to the memory cells of a row connected to the word line. The bit-line pair is used to access information stored or to be stored in the memory cells activated by the word line. Although the memory device 100 in FIG. 1 is shown to include only one memory array 110 for ease of discussion, the memory device 100 can include multiple memory arrays 110.

The local I/O circuit 150 may detect voltages at the bit-line pairs and compare the voltages for each pair. In some embodiments, when the voltage of a first bit line is higher than the voltage of a second bit line of a bit-line pair, the local I/O circuit 150 may read the output to be logic 1. In addition, when the voltage of a first bit line is lower than the voltage of the second bit line of the bit-line pair, the local I/O circuit 150 may read the output to be logic 0.

The global I/O circuit 160 may be configured to combine I/O signals from the local I/O circuits 150. For example, the memory device 100 may include a plurality of memory arrays 140, and each memory array 140 has a respective local I/O circuit 150. The global I/O circuit 160 may combine the I/O signals from multiple local I/O circuits 150 into a global I/O signal of the memory device 100.

The global control circuit 110 may be configured to control the global I/O circuit 160. For example, the global control circuit 110 may configure the global I/O circuit 160 to select one or more local I/O circuits 150 to read data from or write data to. In another example, the global control circuit 110 may configure a read sequence for the global I/O circuit 160 to read data from, or a write sequence to write data to one or more local I/O circuits 150.

Figure 2:
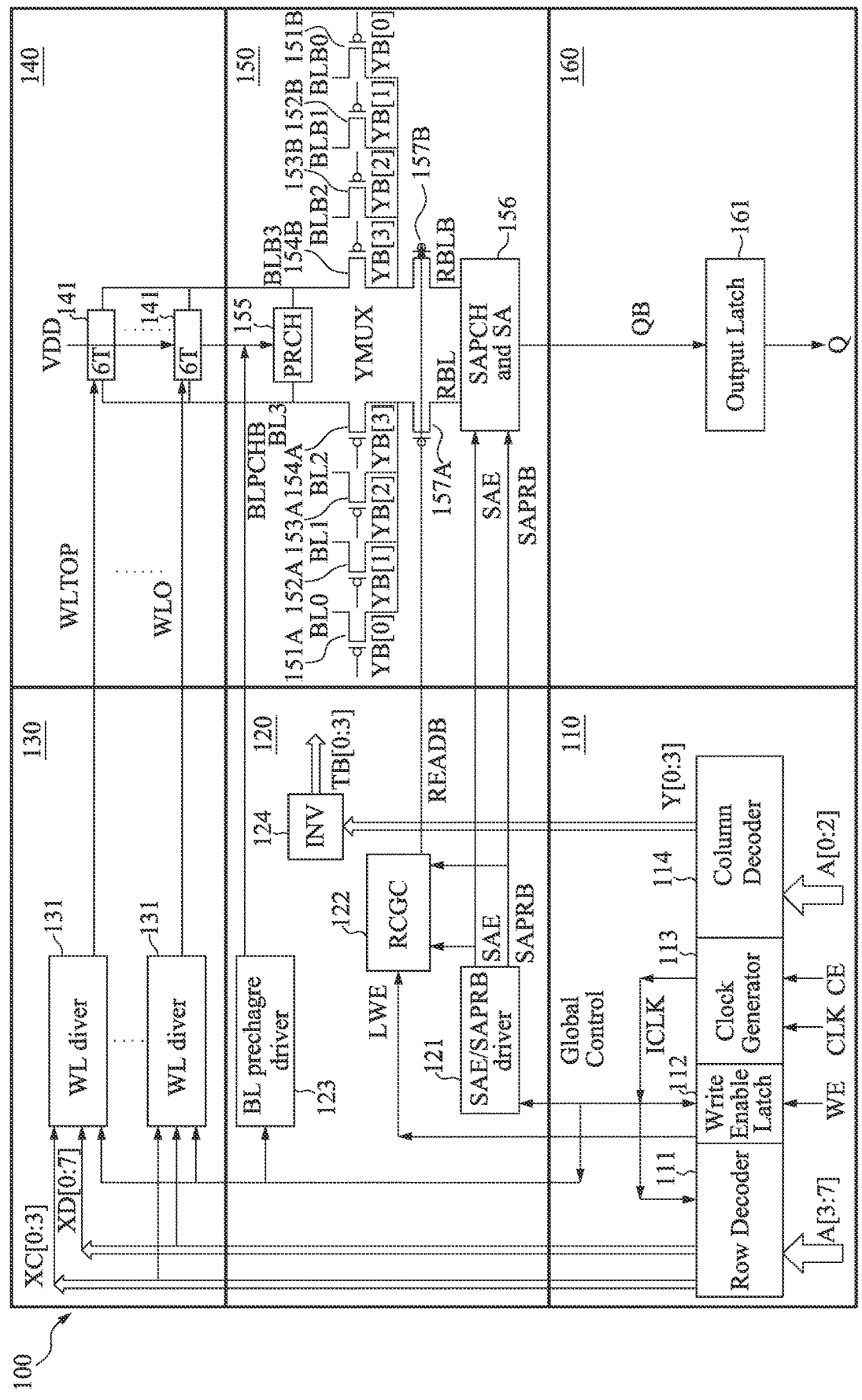
FIG. 2 is a detailed block diagram of the memory device in accordance with the embodiment of FIG. 1.

FIG. 2 is a detailed block diagram of the memory device in accordance with the embodiment of FIG. 1. Please refer to FIG. 1 and FIG. 2.

As shown in FIG. 1, the global control circuit 110 may receive a number of signals that facilitate operations, such as a write enable signal WE, a clock signal CLK, and a clock enable signal CE. In addition, the global control circuit 110 may receive an address signal A[0:7]. The global control circuit 110 may include a row decoder 111, a write enable latch 112, a clock generator 113, and a column decoder 114, as shown in FIG. 2.

The write enable latch 112 receives a write enable signal WE from an external input and the internal clock signal ICLK generated by the clock generator 306. The write enable latch 112 generates a latched write enable signal LWE based on the write enable signal WE and the internal clock signal ICLK. For example, write enable latch 112 can output the latched write enable signal LWE, which is in a high-logic state (e.g., '1'), to the local control circuit 120 when the write enable signal WE is also in a high-logic state (e.g., '1'). When the write enable signal WE is in the logic-high state (e.g., '1'), memory device 100 performs a write operation. When the write enable signal WE is in a low-logic state (e.g., '0'), the latched write enable signal LWE is also in a low-logic state (e.g., '0') and the memory device 100 performs a read operation.

The clock generator 113 receives both a clock signal CLK and a clock enable signal CE. The clock enable signal CE drives operation of the memory device 100. When the clock enable signal CE is in the high-logic state (e.g., '1'), the memory device 100 is operational and the internal clock signal ICLK is generated. When the clock enable signal CE is in a low-logic state (e.g., '0'), the memory device 100 is non-operational and the internal clock signal ICLK is not generated. The clock generator 113 outputs an internal clock signal ICLK to the local control circuit 120 and the write enable latch 112.

The row decoder 111 may receive the most significant five bits (i.e., A[3:7]) of the address signal A[0:7], and output a decoded word-line address signals WC[0:3] and XD[0:7] to the word-line drivers 131 of the word-line driver circuit 130. The column decoder 114 may receive the least significant three bits (i.e., A[0:2]) of the address signal A[0:7], and output a decoded column address signal Y[0:3] to the inverter 124 of the local control circuit 120.

The local control circuit 120 may include a SAE/SAPRB driver 121 (i.e., sense amplifier enable/sense amplifier pre-charge driver), a read-clock generation circuit (RCGC) 122, a bit-line (BL) pre-charge driver 123, and an inverter 124. The SAE/SAPRB driver 121 may be configured to generate a sense amplifier enable signal SAE and a sense amplifier pre-charge signal SAPRB based on the internal clock signal ICLK. The read-clock generation circuit 122 may generate an read enable signal READB according to the latched write enable signal LWE, the sense amplifier enable signal SAE, and the sense amplifier pre-charge signal SAPRB, and output the read enable signal READB to the transistors 157 and 158 (i.e., bit line read switches, or read switches) of the local I/O circuit 150 so as to control the timing of the read operation of the memory device 100. The operations of the read-clock generation circuit 122 are described in detail in the embodiment of FIG. 3. The read enable signal READB is a low-active signal. The bit-line pre-charge driver 123 may be configured to output a bit-line pre-charge signal BLPCHB according to the internal clock signal ICLK. The inverter 124 may inverts the decoded address signal Y[0:3] received from the column decoder 114.

The word-line driver circuit 130 may include a plurality of word-line drivers 131, and each of the word-line drivers 131 may operate the memory cells 141 (e.g., 6T SRAM cells) in the corresponding row of the memory array 140. For example, WLTOP in FIG. 2 may represent the top row of the memory cells 141 in the memory array 140, and WL0 in FIG. 2 may represent the first row of the memory cells 141 in the memory array 140. When the address portion of the word line is in a high-logic state (e.g., '1'), the complementary bit-line pair BL3/BLB3 is turned off so as to enable the word lines of the memory array 140. This in turn discharges the read bit-line pair (e.g., RBL/RBLB) and results in the memory cells 141 storing a high-logic state (e.g., '1')

The local input/output circuit 150 may include a plurality of transistors 151A-154A, 151B-154B, bit line read switches 157A and 157B, a pre-charge circuit (PRCH) 155, and a sense amplifier 156. The transistors 151A-154A and 151B-154B can be regarded as YMUX pass gates or column-address pass gates, and they may include multiple transistor pairs. For example, the transistors 151A and 151B may form a transistor pair that is coupled to the corresponding bit-line pair (e.g., BL0/BLB0), and their gates receive the same inverse address portion (e.g., YB[0]) output from the inverter 124 of the local control circuit 120. Similarly, the transistors 152A and 152B, 153A and 153B, and 154A and 154B can be regarded as different transistor pairs that are coupled to corresponding bit-line pairs (e.g., BL1/BLB1, BL2/BLB2, BL3/BLB3), and they receive the corresponding inverse address portion (e.g., YB[1], YB[2], and YB[3]) output from the inverter 124 of the local control circuit 120.

When the address portion is in a low-logic state (e.g., '0') to the gate of one or more of the transistors 151A-154A and 151B-154B (e.g., PMOS transistors), the respective transistor is turned on. Alternatively, when the address portion is in a high-logic state (e.g., '1') to a gate of one or more of the transistors 151A-154A and 151B-154B, the respective transistor is turned off and the voltage coupled to the source/drain terminal of that transistor is passed through the transistor. The bit line read switches 157A and 157B can be regarded as read pass gates, and are controlled by the read enable signal READB.

Figure 3:
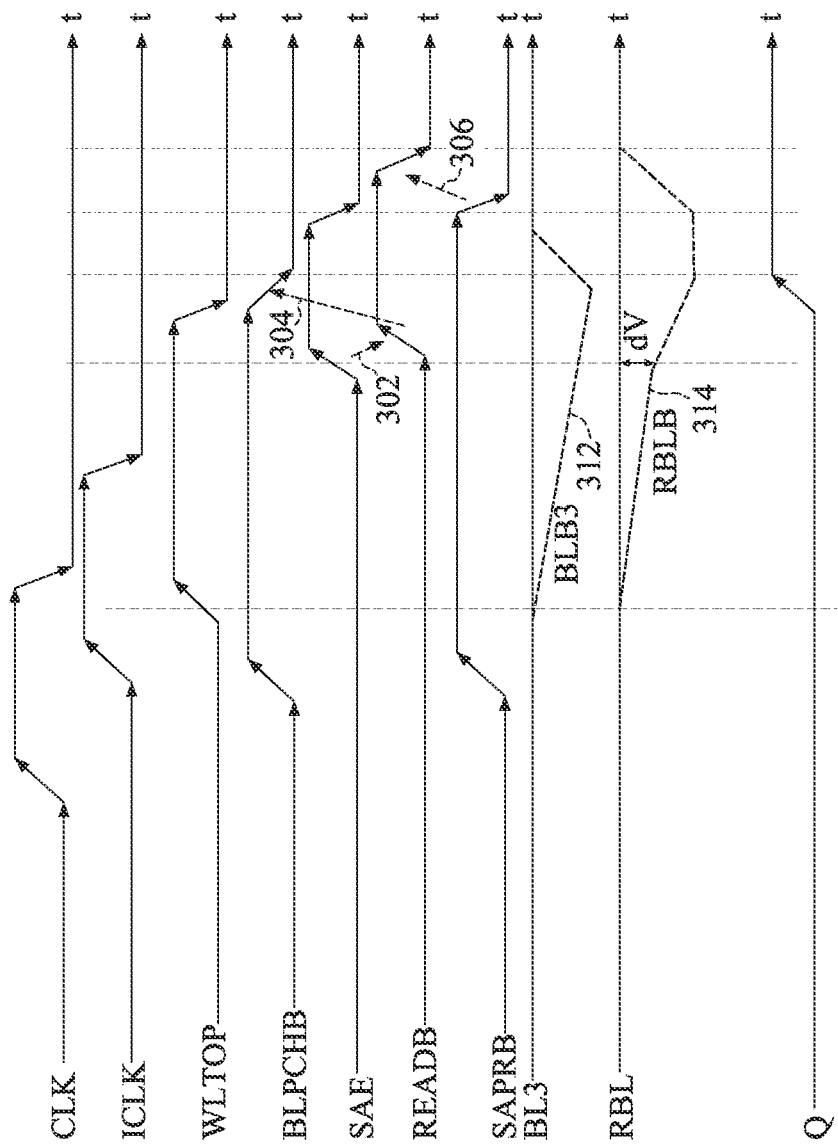
FIG. 3 is a waveform diagram illustrating various signals in the memory device in accordance with the embodiment of FIG. 2.

FIG. 3 is a waveform diagram illustrating various signals in the memory device in accordance with the embodiment of FIG. 2. Please refer to FIG. 2 and FIG. 3.

FIG. 3 gives an overview of operations of the signals in the memory device 100. In an embodiment, a memory read operation of the memory device 100 may start at the rising edge of the internal clock signal ICLK which is generated by the clock generator 113. The Y addresses Y[0:3] are decoded latched column addresses, and the X addresses XC[0:3] and XD[0:7] are decoded latched row addresses. In addition, the row decoder may generate word line signals (e.g., WL0 to WLTOP) based on the selected X addresses and internal clock signal ICLK.

Figure 5:
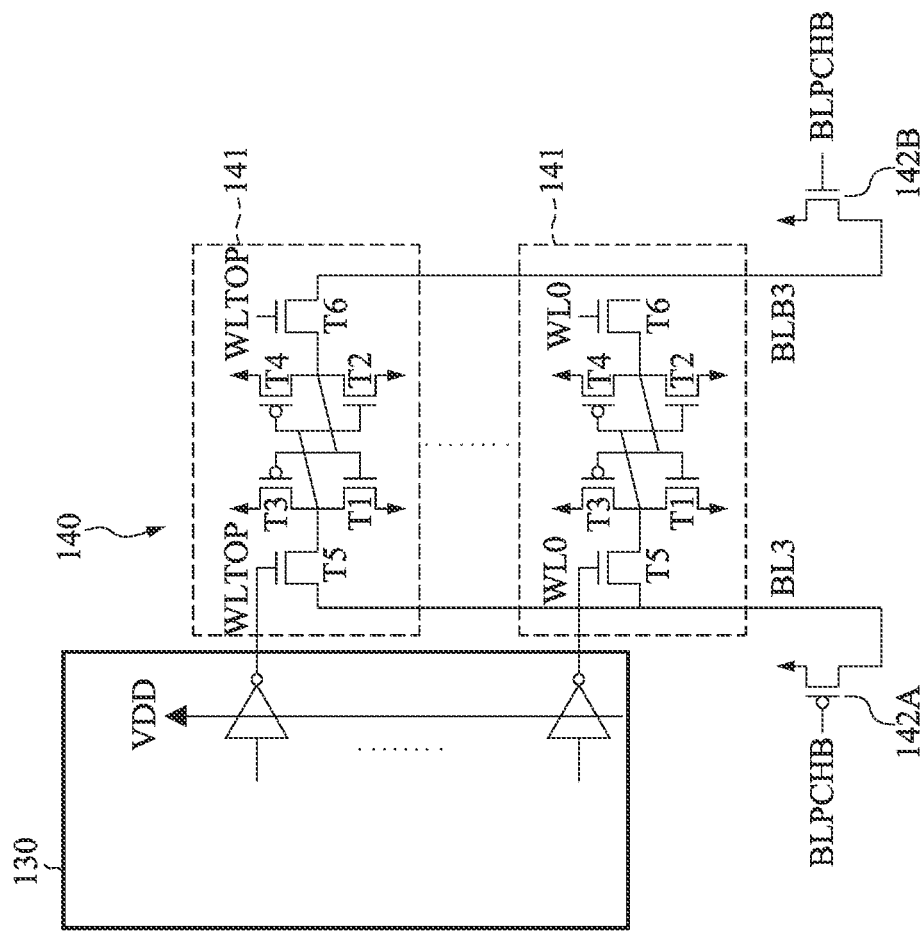
FIG. 5 is a schematic diagram of the memory array of the memory device in accordance with the embodiment of FIG. 2.

When the memory cells 141 on the first row receive the word line signal, such as WL0, one of the bit lines BL[0:3] or BLB[0:3] goes to low-logic state (e.g., '0') based on the data written to the memory cell 141. For example, as shown in FIG. 5, the memory cell 141 in the first row can receive the word line signal WL0 which is in the high-logic state (e.g., '1'), and the transistors T5 and T6 of the memory cell 141 are turned on. In FIG. 5, a read '1' operation is shown, and the bit line BLB3 is discharged and the bit line BL3 is retained in the high-logic state (e.g., '1'), as shown in the waveforms of FIG. 3.

When the read pass gates (i.e., transistors 157A and 157B) are turned on (i.e., READB in the low-logic state), the logic states of the read bit lines RBL and RBLB will respectively follow the logic states of the bit lines BL3 and BLB3. The sense amplifier 156 will detect differential signal (dV) developed between the read bit lines RBL and RBLB at each rising edge of the internal clock ICLK. After the sense amplifier enable signal is changed to the high-logic state (e.g., '1'), the read pass gates (i.e., transistors 151A-154A and 151B-154B) should be turned off to prevent the bit lines from being driven by the sense amplifier 156. That is, the read enable signal READB is set to the high-logic state (e.g., '1') after the sense amplifier enable signal SAE is changed to the high-logic state (i.e., arrow 302).

The voltage levels of the bit line BLB3 and the read bit line RBLB are shown by curves 312 and 314 in FIG. 3. After the read operation of the sense amplifier 156 is completed (e.g., RBLB=0), the sense amplifier enable signal SAE is changed to the low-logic state (e.g., '0'), and the sense amplifier pre-charge signal SAPRB is also changed to the low-logic state (i.e., arrow 304) so as to pre-charge the read bit lines RBL and RBLB back to the high-logic state (e.g., '1') for the next read cycle. The read enable signal READB is changed to the low-logic state (e.g., '0') after the read enable signal READB is changed to the low-logic state (i.e., arrow 306).

More specifically, the memory device 100 is designed so that the subsequent two events occur in sequence to prevent a race condition between the read enable signal READB and the sense amplifier pre-charge signal SAPRB. For example, the first event may indicate that the read bit lines RBL and RBLB are pre-charged to 70% of the power supply voltage (e.g., VDD), and the second event may indicate that the read enable signal READB should fall to 30% of the power supply voltage (e.g., VDD).

Conversely, if the sequence of the first event and the second event cannot be guaranteed (i.e., a potential the race condition between the read enable signal READB and the sense amplifier pre-charge signal SAPRB), there may be charge sharing between the read bit line RBLB and the bit line BLB3, so the voltage of the bit line BLB3 will fall again after being pre-charged. This will impact the cycle time significantly in high speed SRAM designs, and significant unnecessary power dissipation can occur.

Figure 4:
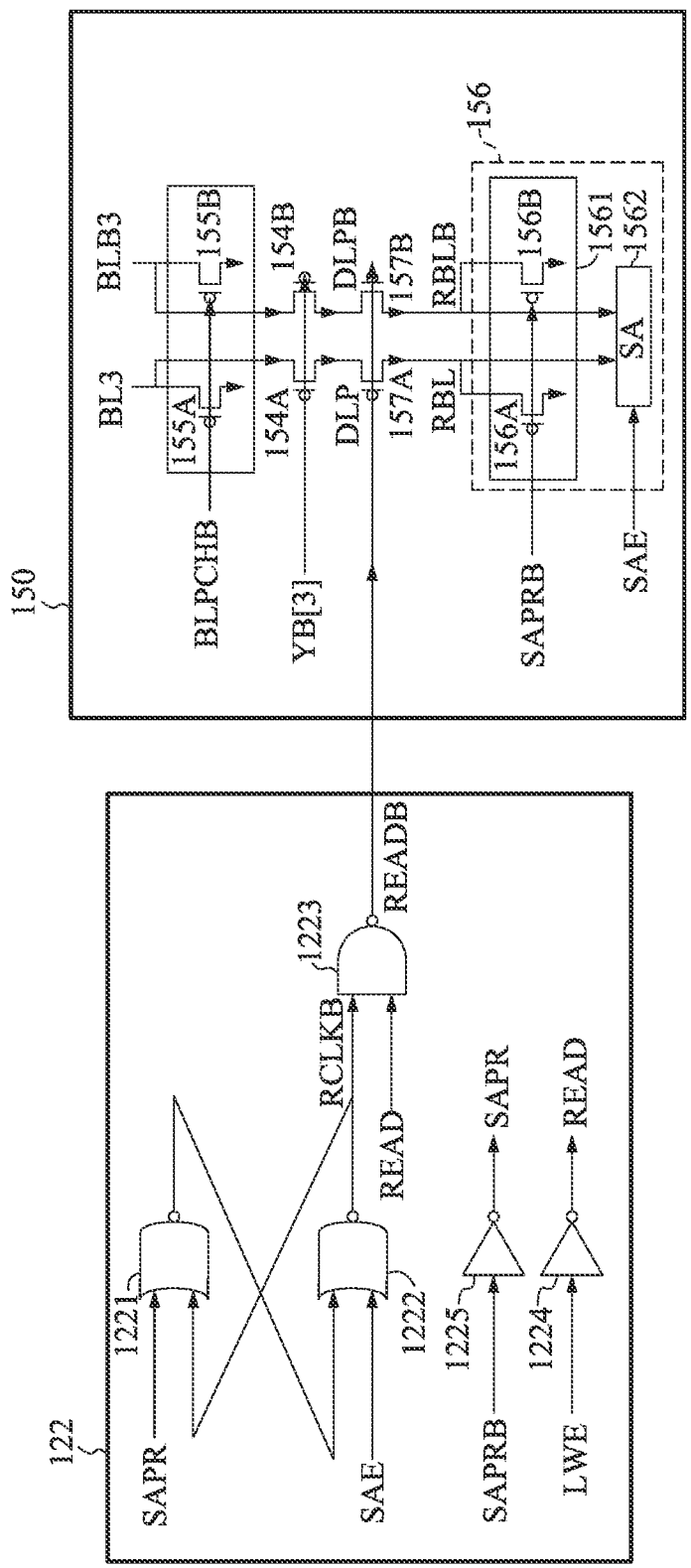
FIG. 4 is a schematic diagram of the read-clock generation circuit in accordance with the embodiment of the FIG. 2.
Figure 6:
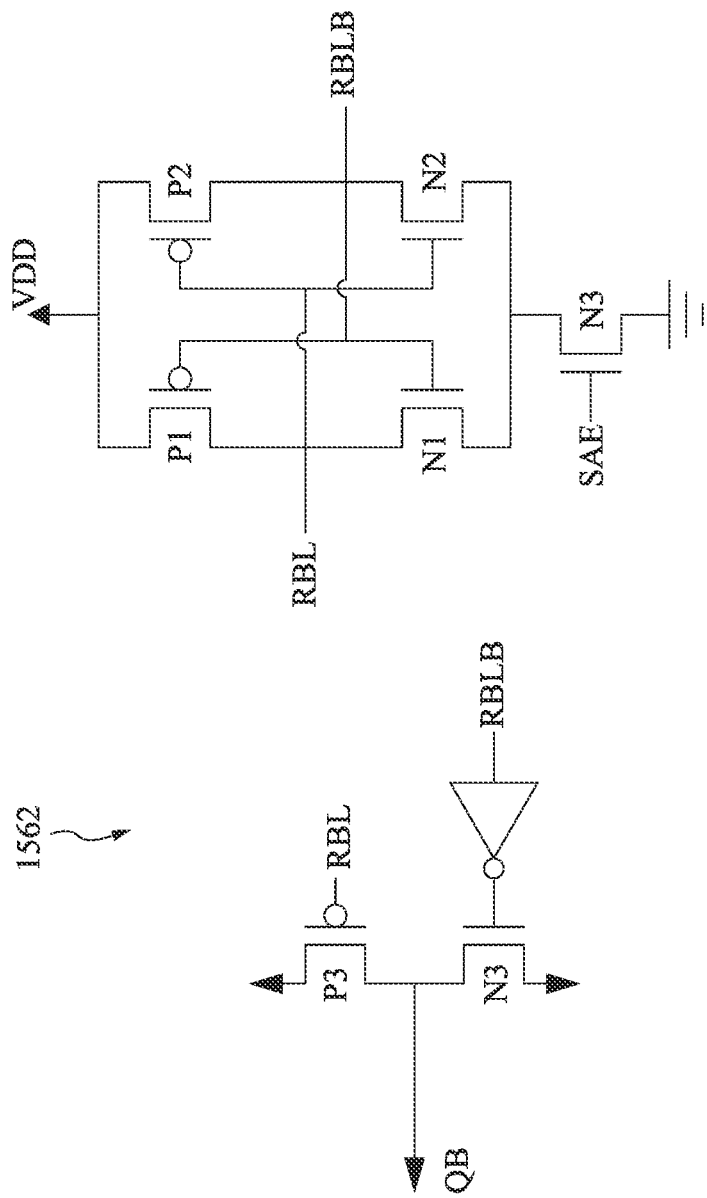
FIG. 6 is a schematic diagram of the sense amplifier circuit in accordance with the embodiment of FIG. 4.
Figure 7:
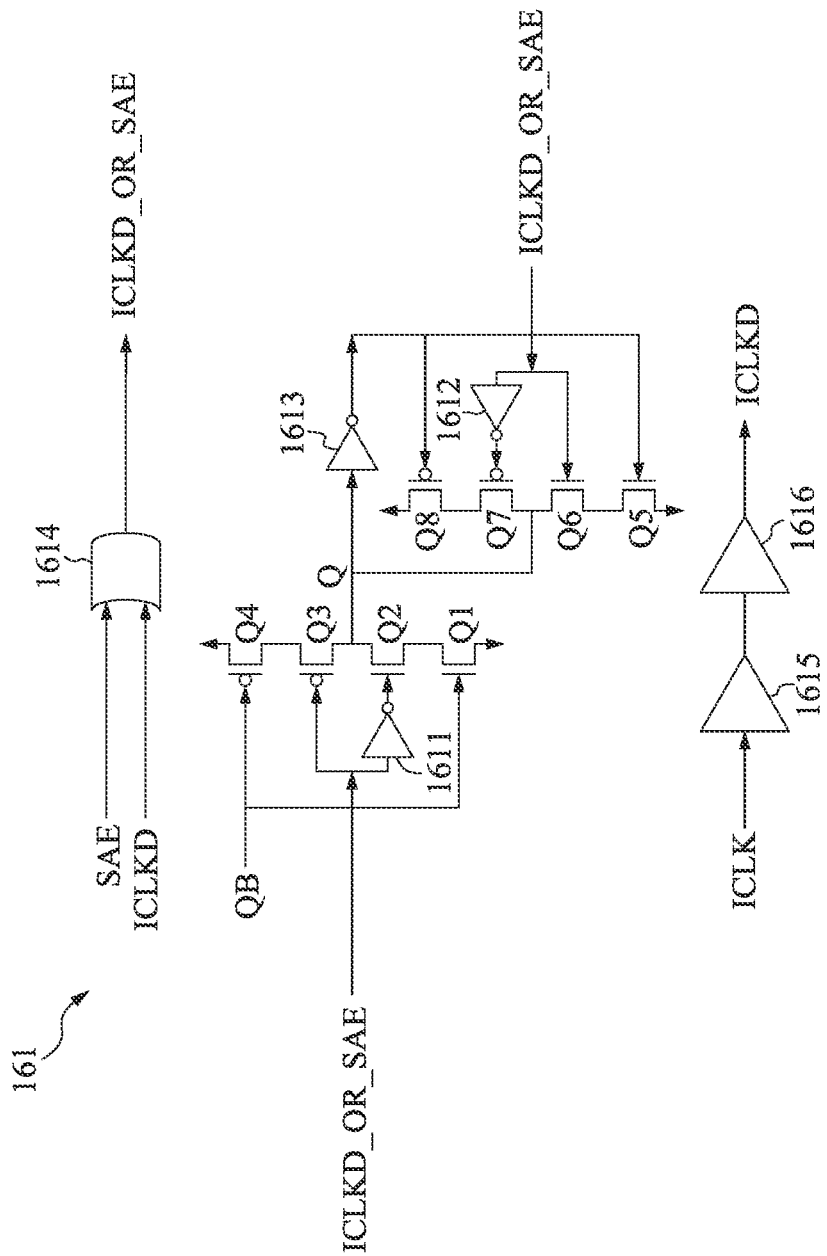
FIG. 7 is a schematic diagram of the output latch in accordance with the embodiment of FIG. 4.
Figure 8:
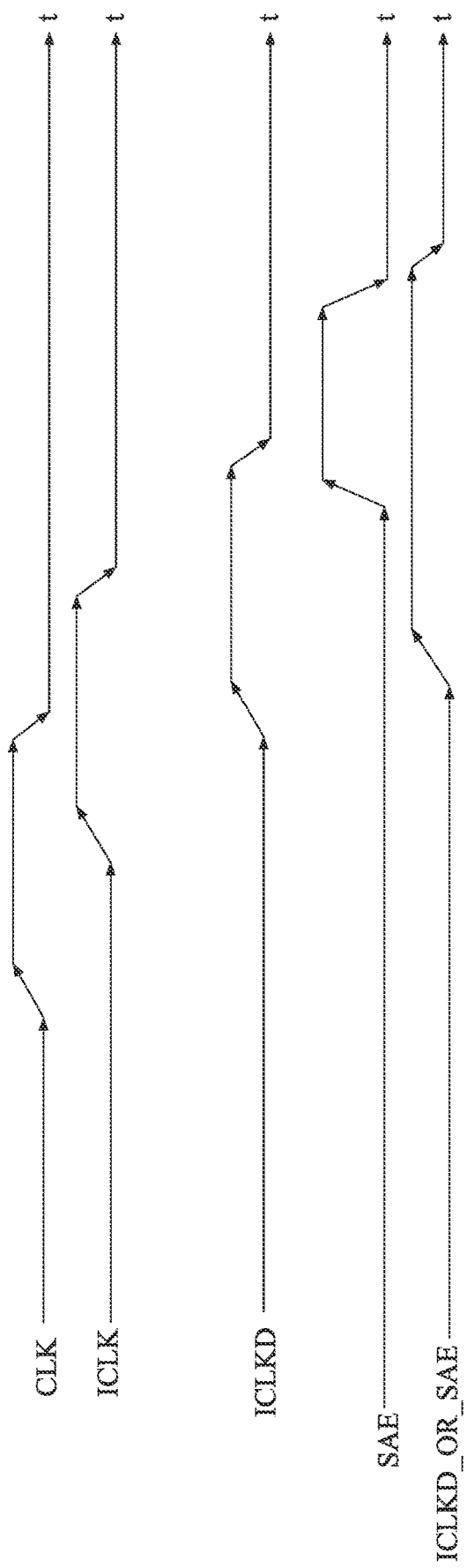
FIG. 8 is a waveform diagram illustrating various signals in the output latch in accordance with the embodiment of FIG. 7.
Figure 9:
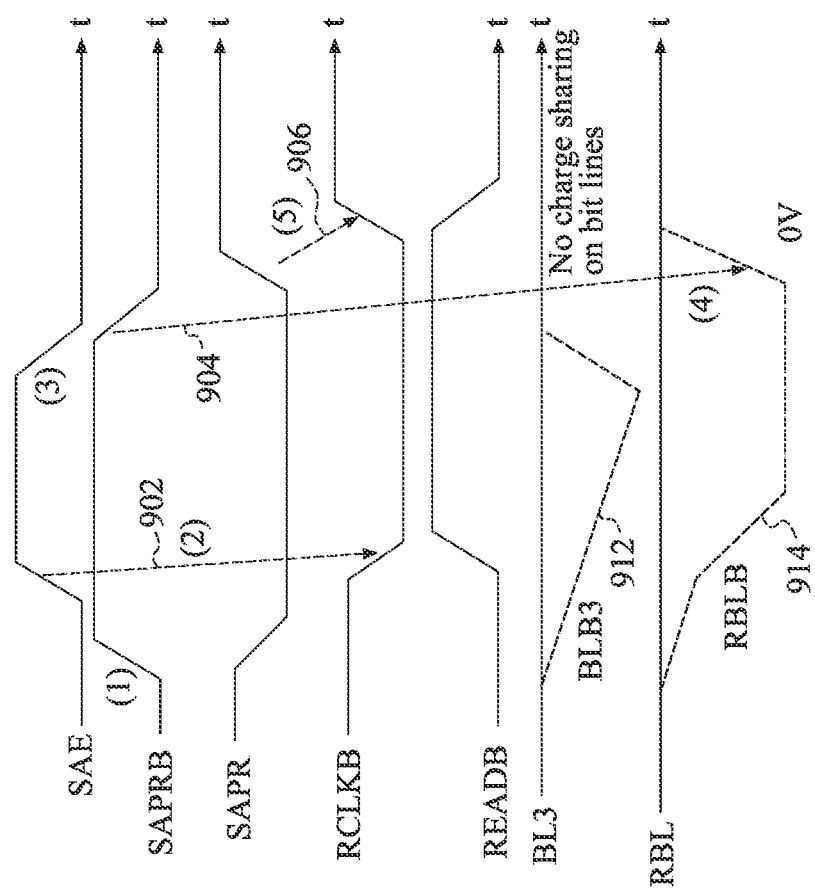
FIG. 9 is a waveform diagram illustrating various signals in the read-clock generation circuit in accordance with the embodiment of FIG. 4.

FIG. 4 is a schematic diagram of the read-clock generation circuit in accordance with the embodiment of the FIG. 2. FIG. 5 is a schematic diagram of the memory array of the memory device in accordance with the embodiment of FIG. 2. FIG. 6 is a schematic diagram of the sense amplifier circuit in accordance with the embodiment of FIG. 4. FIG. 7 is a schematic diagram of the output latch in accordance with the embodiment of FIG. 4. FIG. 8 is a waveform diagram illustrating various signals in the output latch in accordance with the embodiment of FIG. 7. FIG. 9 is a waveform diagram illustrating various signals in the read-clock generation circuit in accordance with the embodiment of FIG. 4. Please refer to FIGS. 2 to 9.

As shown in FIG. 4, the read-clock generation circuit 122 may include logic gates 1221, 1222, and 1223, and inverters 1224 and 1225. The inverters 1224 and 1225 may invert the latched write enable signal LWE and the sense amplifier pre-charge signal SAPRB to generate a read enable signal READ and a sense amplifier pre-charge signal SAPR, respectively.

The logic gates 1221 and 1222 (i.e., NOR gates) forms an RS latch. The sense amplifier pre-charge signal SAPR is provided to the first input terminal of the logic gate 1221 (i.e., a NOR gate), and the read enable signal READ is provided to the second input terminal of the logic gate 1223 (i.e., a NAND gate). The logic gate 1221 generates an inverse read clock signal RCLKB at its output terminal. The output terminal of the logic gate 1221 is connected to the first input terminal of the logic gate 1222 (i.e., a NOR gate), and the second input terminal of the logic gate 1221 is connected to the output terminal of the logic gate 1222. The sense amplifier enable signal SAE is provided to the second input terminal of the logic gate 1222. The logic gate 1223 may generate a read enable signal READB according to the inverse read clock signal RCLKB and the read enable signal READ, and output the read enable signal READB to the transistors 157A and 157B (e.g., the bit-line read switches) of the local I/O circuit 150. In the following sections, the operations of the read-clock generation circuit 122 are detailed.

In a standby mode of the read-clock generation circuit 122, when the internal clock signal ICLK is in the low-logic state (e.g., '0'), both the sense amplifier enable signal SAE and the sense amplifier pre-charge signal SAPRB are in the low-logic state (e.g., '0'). Accordingly, the sense amplifier pre-charge signal SAPR is in the high-logic state (e.g., '1') in the standby mode since the sense amplifier pre-charge signal SAPRB is in the low-logic state (e.g., '0'). At this time, the output signal of the logic gate 1221 is in the low-logic state (e.g., '0'). Since the sense amplifier enable signal SAE is also in the low-logic state (e.g., '0'), the output signal of the logic gate 1222 is in the high-logic state. Therefore, the inverse read clock signal RCLKB is in the high-logic state (e.g., '1'). In addition, when the memory device 100 is to perform a read operation, the write enable signal WE is in the low-logic state (e.g., '0'), and thus the read enable signal READ is in the high-logic state (e.g., '1'). Since the inverse read clock signal RCLKB and the read enable signal READ are both in the high-logic state (e.g., '1') in the standby mode, the logic gate 1223 (i.e., a NAND gate) outputs the read enable signal READB in the low-logic state (e.g., '0') in the standby mode of the read-clock generation circuit 122.

Since the read enable signal READB, which is provided to the gates of the transistors 157A and 157B, is in the low-logic state (e.g., '0') in the standby mode, the transistors 157A and 157B are turned on in the standby mode. Meanwhile, the address portion YB[3] is in the low-logic state (e.g., '0') for the selected column in the standby mode. Since the address portion YB[3] is provided to the gates of the transistors 154A and 154B, the transistors 154A and 154B are turned on in the standby mode. Because the transistors 154A-154B and 157A-157B are turned on for the selected column, the read bit-lines RBL and RBLB (i.e., read bit-line pair) are respectively connected to the bit lines BL and BLB (i.e., bit-line pair) for the selected column.

After the rising edge of the internal clock signal ICLK, the bit lines BL and BLB will be discharged upon arrival of the word line signal (e.g., WL0 for the first row). At this time, the logic states of the read bit lines RBL and RBLB will follow the logic states the bit lines BL and BLB, respectively.

In addition, after the rising edge of the internal clock signal ICLK, the sense amplifier enable signal SAE and the sense amplifier pre-charge signal SAPRB will also go to the high-logic state (e.g., '1'). For example, the sense amplifier pre-charge signal SAPRB first goes to the high-logic state (e.g., '1') after the rising edge of the internal clock signal ICLK, as shown by operation (1) in FIG. 9. At this time, both inputs (i.e., SAE and SAPRB) of the RS latch (i.e., logic gates 1221 and 1222) are in the low-logic state, so the output of the RS latch (i.e., RCLKB) stays in the high-logic state (e.g., '1') which is the same as the logic state in the standby mode, and the RS latch is in the hold mode.

Then, the sense amplifier enable signal SAE also goes to the high-logic state (e.g., '1'), as shown by operation (2) in FIG. 9, and the output of the RS latch (i.e., RCLKB) is reset to the low-logic state (e.g., '0'), as shown by arrow 402. At this time, since the read enable signal READ is in the low-logic state (e.g., '0'), the logic gate 1223 will change the read enable signal READB to the high-logic state (e.g., '1'). Thus, the transistors 157A and 157B will be turned off since the read enable signal READB is in the high-logic state (e.g., '1'). The sense amplifier 156 will amplify the voltage difference between the read bit lines RBL and RBLB so as to provide an output signal QB.

For example, the sense amplifier 156 may include a sense amplifier pre-charging circuit (SAPCH) 1561 and a sense amplifier circuit (SA) 1562, as shown in FIG. 4. The pre-charging circuit 1561 may include transistors 156A and 156B that are controlled by the sense amplifier pre-charge signal SAPRB. More specifically, when the sense amplifier pre-charge signal SAPRB is in the high-logic state (e.g., '1'), the transistors 156A and 156B are turned off, and the read bit lines RBL and RBLB are pre-charged. When the sense amplifier pre-charge signal SAPRB is in the low-logic state (e.g., '0'), the transistors 156A and 156B are turned on, and the logic states of the read bit lines RBL and RBLB are passed to the sense amplifier circuit 1562 which is controlled by the sense amplifier enable signal SAE. The schematic diagram of the sense amplifier circuit 1562 is shown in FIG. 6. When the sense amplifier enable signal SAE is in the low-logic state (e.g., '0'), the transistor N3 is turned off, and the sense amplifier circuit 1562 will cease detection of the voltage difference between the read bit lines RBL and RBLB. When the sense amplifier enable signal SAE is in the high-logic state (e.g., '1'), the transistor N3 is turned on, and the sense amplifier circuit 1562 will detect voltage difference between the read bit lines RBL and RBLB that are respectively connected to the gates of the transistor P3 and N3, and the output signal QB is generated and output to the output latch 161.

The schematic diagram of the output latch 161 is shown in FIG. 7, and the waveforms of the signals in the output latch 161 are shown in FIG. 8. For example, the output latch 161 may include inverters 1611 to 1613, logic gate 1614, buffers 1615 and 1616, and transistors Q1 to Q8. The internal clock signal ICLK, which is generated by the clock generator 113 based on the clock signal CLK, passes through the buffers 1616 and 1616 to generate a delayed internal clock signal ICLKD, where the waveforms of the clock signal CLK, internal clock signal ICLK, and delayed internal clock signal ICKD are shown in FIG. 8. The delayed internal clock signal ICLKD and the sense amplifier enable signal SAE are input to the logic gate 1614 (i.e., an OR gate) to generate a control signal ICLKD_OR_SAE. That is, the control signal ICKD_OR_SAE is an ORed signal of the delayed internal clock signal ICLKD and the sense amplifier enable signal SAE, as shown in FIG. 8. The control signal ICLKD_OR_SAE is input to the latch formed by transistors Q1 to Q8 and inverters 1611 to 1613 to obtain the output signal Q of the memory device 100.

Now attention is directed back to FIG. 4 and FIG. 9. At the end of the read operation, the sense amplifier enable signal SAE is changed to the low-logic state (e.g., '0'), as shown by operation (3) in FIG. 9. The output of the RS latch is maintained in the low-logic state (e.g., '0') since the inputs (i.e., SAE and SAPRB) of the RS latch are both in the low-logic state (e.g., '0'). At this time, the RS latch is in the hold mode.

Afterwards, the sense amplifier pre-charge signal SAPRB (i.e., a low-active signal) goes to the low-logic state, as shown by operation (4) in FIG. 9, and the transistors 156A and 156B are turned on to start pre-charging the read bit lines RBL and RBLB. Then, the sense amplifier pre-charge signal SAPR goes to the high-logic state (e.g., '1') after the delay of the inverter 1225), as shown by operation (5) and arrow 906 in FIG. 9, and the output of the RS latch (i.e., RCLKB) is set to the high-logic state (e.g., '1'). Therefore, the RS latch is set to the standby mode for the next clock cycle of the internal clock signal ICLK.

In the embodiment, the read enable signal READB goes to the low-logic state (e.g., '0') after the read bit lines RBL and RBLB are pre-charged, and thus there is no charge sharing on the bit lines BL3 and BLB3 after the bit lines BL3 and BLB3 are pre-charged. Therefore, the cycle time of the memory device 100 can be improved, and unnecessary power consumption prevented in the memory device 100. More details about the technical advantages of the memory device 100 are provided in the embodiment of FIG. 11.

Figure 10:
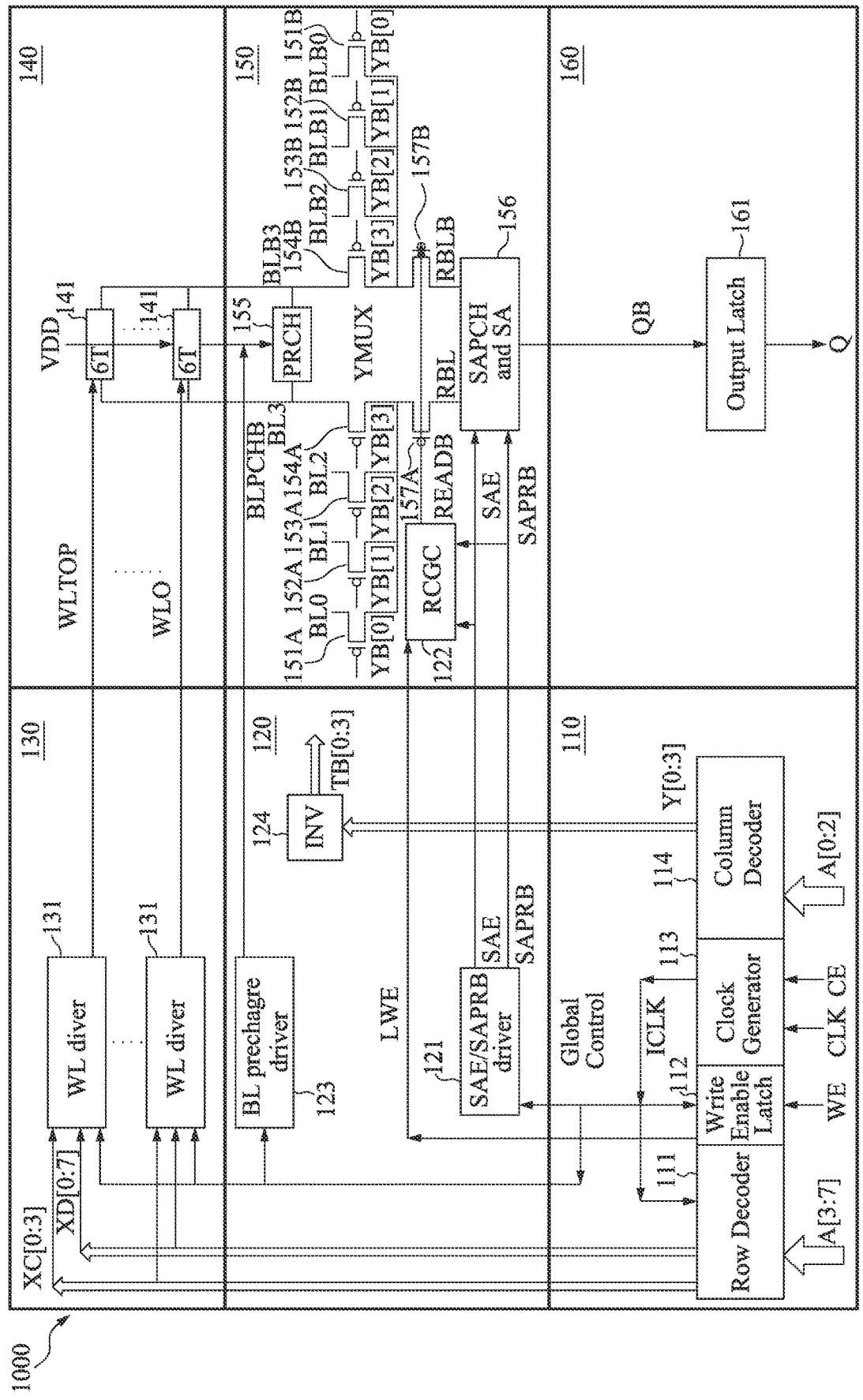
FIG. 10 is a block diagram of the memory device in accordance with another embodiment of the disclosure.

FIG. 10 is a block diagram of the memory device in accordance with another embodiment of the disclosure.

The components of the memory device 1000 in FIG. 10 are similar to those of the memory device 100 in FIG. 2, and the difference between FIG. 10 and FIG. 2 is that the read-clock generation circuit 122 in FIG. 10 is disposed in the local I/O circuit 150. Although the placement of the read-clock generation circuit 122 in FIG. 10 differs from that in FIG. 2, it can provide a technical advantage to prevent from the race condition so as to avoid charge sharing between the read bit lines (e.g., RBL/RBLB) and bit lines (e.g., BL3/BLB3). More specifically, in every process node in deep micron technologies (e.g., 5 nm, 3 nm, or less), resistance of metal wires is increased significantly. If the RC (resistance-capacitance) product of the sense amplifier pre-charge signal SAPRB in the local I/O circuit 150 is greater than that of the read enable signal READB, the pre-charging delay of the bit lines BL and BLB will become longer. Thus, the sequence of the first event (i.e., bit lines RBL/RBLB are pre-charged to 70% of the power supply voltage) and the second event (i.e., the read enable signal READB falls to 30% of the power supply voltage) may not be guaranteed. Once the second event occurs prior to the first event, the charge sharing between the bit line BL/BLB and read bit line RBL/RBLB will happen.

In the embodiment of FIG. 10, since the read-clock generation circuit 122 is disposed in the local I/O circuit 150, the resistance of metal wires of the read enable signal READB in FIG. 10 can be significantly reduced in comparison with that in the embodiment of FIG. 2. In addition, the difference between the resistances of metal wires of the sense amplifier pre-charge signal SAPRB and the read enable signal READB can be reduced as well. In other words, the RC product of the sense amplifier pre-charge signal SAPRB may be close to that of the read enable signal READB. Thus, the race condition between the read enable signal READB and the pre-charging of the read bit lines RBL/RBLB can be prevented, and the sequence of the first event and the second event can be further guaranteed in the embodiment of FIG. 10.

Figure 11:
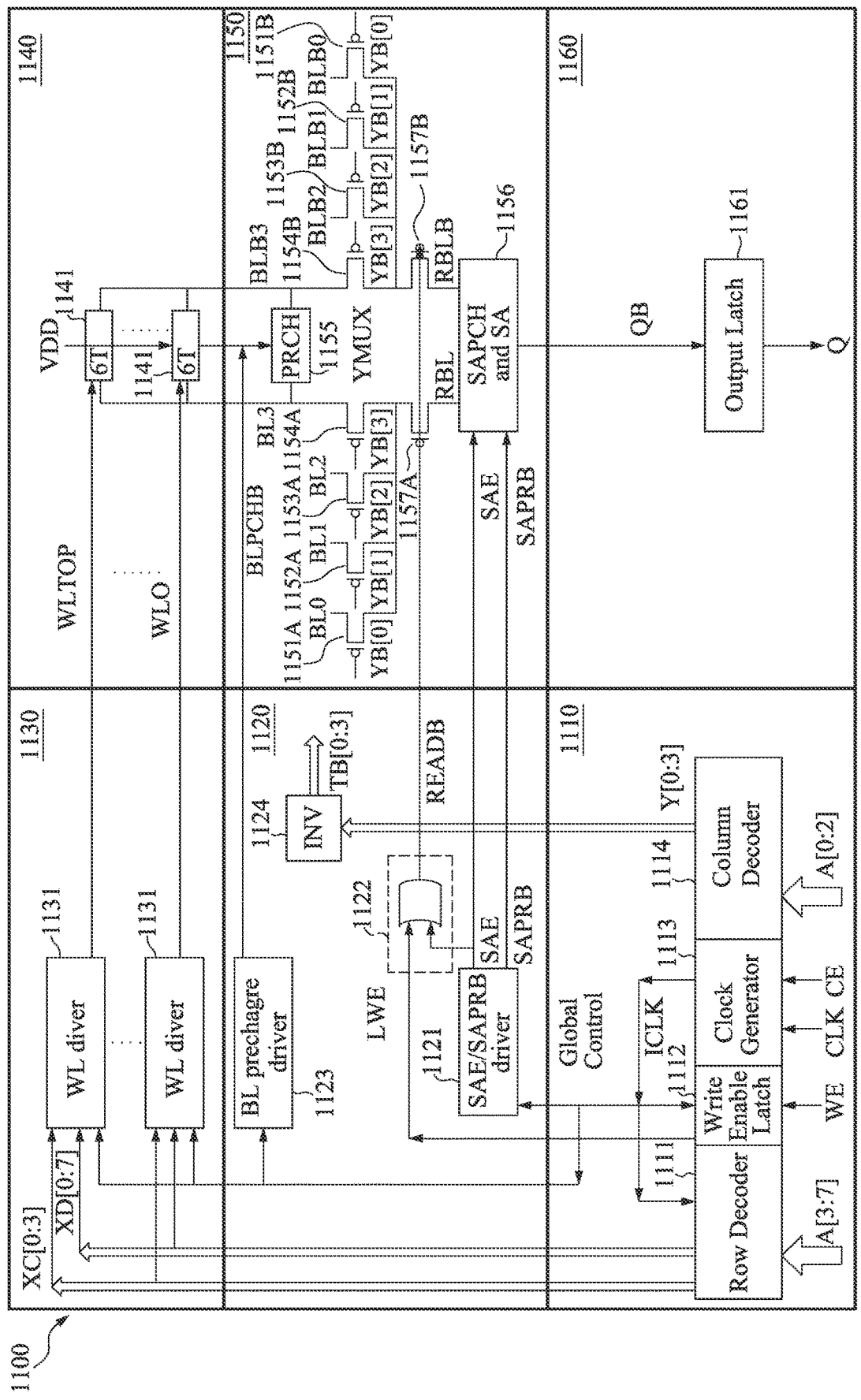
FIG. 11 is a block diagram of a memory device in accordance with a comparative embodiment of the disclosure.
Figure 12:
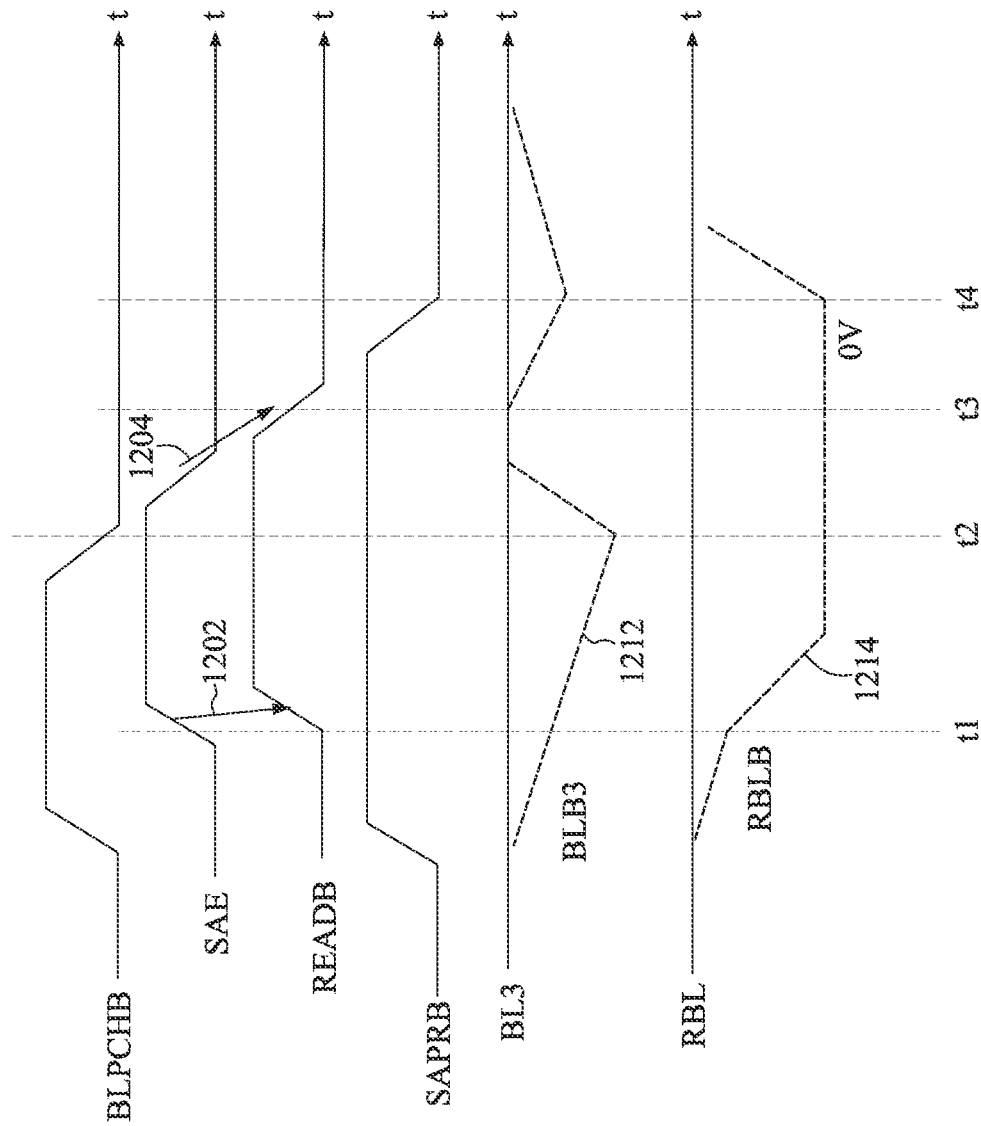
FIG. 12 is a waveform diagram of various signal in the memory device 1100 in accordance with the embodiment of FIG. 11.

FIG. 11 is a block diagram of a memory device in accordance with a comparative embodiment of the disclosure. FIG. 12 is a waveform diagram of various signals in the memory device 1100 in accordance with the embodiment of FIG. 11. Please refer to FIG. 2 and FIGS. 11-12.

The components in the memory device 1100 in FIG. 11 are similar to those in the memory device 100 in FIG. 2. The difference is that the read enable signal READB in FIG. 11 is generated using an OR gate 1122. For example, the latched write enable signal LWE and the sense amplifier enable signal SAE are input to the OR gate 1122 to generate the read enable signal READB. As shown in FIG. 12, the sense amplifier pre-charge signal SAPRB first goes to the high-logic state (e.g., '1') after the rising edge of the internal clock signal ICLK at time t1. Then, the sense amplifier enable signal SAE also goes to the high-logic state (e.g., '1'). It should be noted that the latched write enable signal is in the low-logic state (e.g., '0') when the memory device 1100 is performing a read operation. Since the read enable signal READB in FIG. 11 is generated by the OR gate 1122, the read enable signal READB goes to the high-logic state (e.g., '1') when the sense amplifier enable signal SAE goes to the high-logic state (e.g., '1'), as shown by arrow 1202 in FIG. 12. At time t2, the bit-line pre-charge signal BLPCHB is changed to the low-logic state (e.g., '0'), and thus the bit line BLB3 starts charging to the power supply voltage VDD.

At the end of the read operation (i.e., a read '1' operation), the sense amplifier enable signal SAE is changed to the low-logic state (e.g., '0'), and thus the read enable signal READB generated by the OR gate 1122 is changed to the low-logic state since the latched write enable LWE is in the low-logic state (e.g., '0'). At this time, the YMUX pass gates (e.g., transistors 1151A-1154A and 1151B-1154B) are still turned on for the selected column, and thus the read bit line RBLB and the bit line BLB3 are connected through the YMUX pass gates and the read pass gates (e.g., transistors 1157A-1157B). In addition, it should be noted that the sense amplifier pre-charge signal SAPRB (i.e., a low-active signal) is still maintained in the high-logic state (e.g., '1'), and the read bit lines RBL and RBLB are not pre-charged, so the voltage level of the read bit line RBLB is kept at 0V. However, in this case, upon the read bit line RBLB being connected to the bit line BLB3 at time t3, the bit line BLB3 starts discharging, so the voltage level of the bit line BLB3 gradually decreases from time t3.

At time t4, the sense amplifier pre-charge signal SAPRB is changed to low-logic state (e.g., '0') to pre-charge the read bit lines RBL and RBLB before the sense amplifier 1156 amplifies the voltage difference between the read bit lines RBL and RBLB to provide the output signal QB. Thus, the read bit line RBLB starts charging from time T4. Meanwhile, because the read bit line RBLB is connected to the bit line BLB3, the bit line BLB3 is also charged from time t4. It should be noted that the bit line BLB3 has a larger capacitance than the read bit line RBL, and it will take more time to pre-charge the read bit line RBL together with the bit line BLB3, which leads to a longer cycle time (i.e., a lower clock speed) and more power dissipation of the memory device 1100 in comparison with the memory device 100 in FIG. 2.

Figure 13:
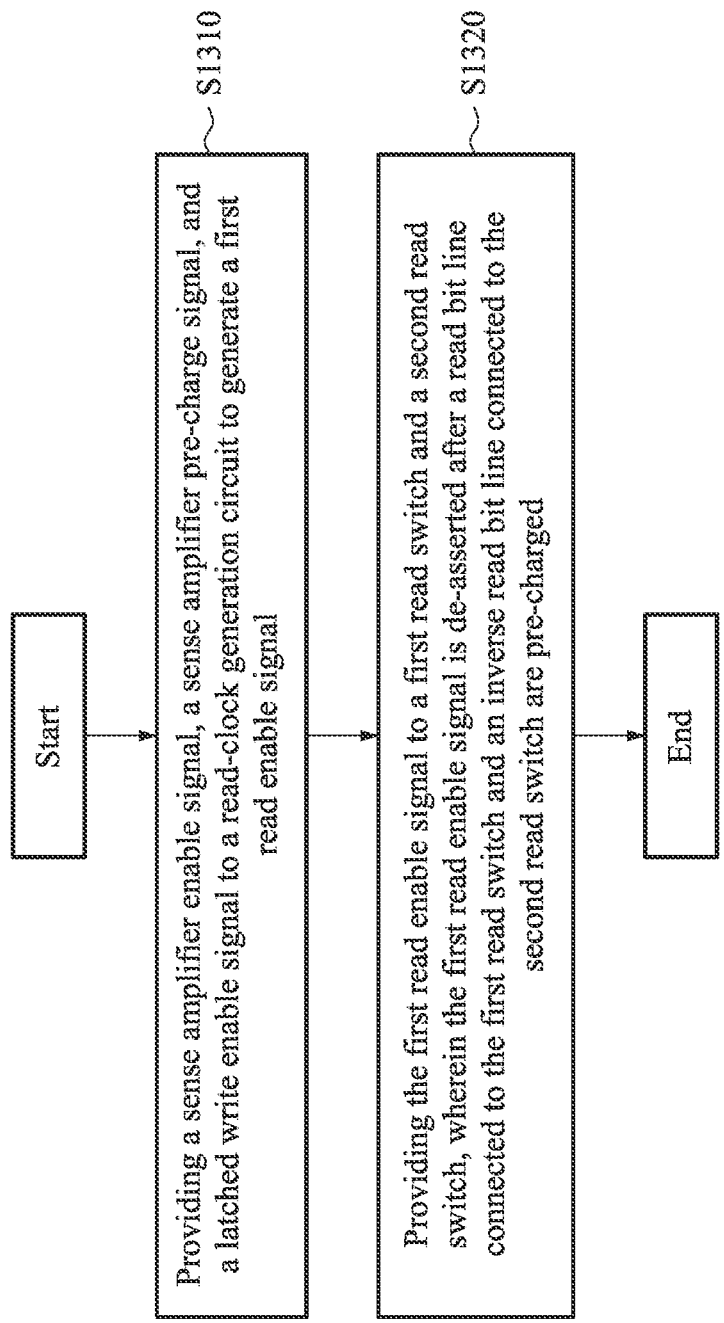
FIG. 13 is a flowchart of a method for controlling a read operation in a memory device in accordance with an embodiment of the disclosure.

FIG. 13 is a flowchart of a method for controlling a read operation in a memory device in accordance with an embodiment of the disclosure. Please refer to FIG. 2 and FIG. 13.

In operation S1310, a sense amplifier enable signal (SAE), a sense amplifier pre-charge signal (SAPRB), and a latched write enable signal (LWE) are provided to a read-clock generation circuit 122 to generate a first read enable signal (READB). For example, referring to FIG. 2, the read-clock generation circuit 122 may receive the sense amplifier enable signal SAE, the sense amplifier pre-charge signal SAPRB, and the latched write enable signal LWE, and generates the read enable signal READB. It should be noted that the signal name with a capitalized B at the last character may indicate a low-active signal, such as READB, SAPRB, BLPCHB, etc.

In operation S1320, the first read enable signal (READB) is provided to a first read switch (e.g., transistor 157A) and a second read switch (e.g., transistor 157B), wherein the first read enable signal is de-asserted after a read bit line signal (e.g., RBL) of the first read switch and an inverse read bit line signal (e.g., RBLB) of the second read switch are pre-charged. For example, the race condition between the read enable signal READB and the pre-charging of the bit lines BL3/BLB3 can be prevented by the memory device 100, and the sequence of the first event (i.e., bit lines RBL/RBLB are pre-charged to 70% of the power supply voltage) and the second event (i.e., the read enable signal READB falls to 30% of the power supply voltage) can be ensured by the memory device 100. Accordingly, there is no charge sharing between the read bit lines (e.g., RBL/RBLB) and bit lines (e.g., BL3/BLB3) after the bit lines BL3/BLB3 are pre-charged during a read operation of the memory device 100, thereby improving the cycle time and reducing unnecessary power dissipation of the memory device 100.

In an embodiment, the present disclosure provides a memory device, which includes a memory array, a read-clock generation circuit, and a local input/output circuit. The memory array includes a plurality of memory cells in a two-dimensional array. The read-clock generation circuit is configured to receive a sense amplifier enable signal, a first sense amplifier pre-charge signal, and a latched write enable signal to generate a first read enable signal. The local input/output circuit includes a plurality of pairs of column-address pass gates, and a pair of read pass gates. The plurality of pairs of column-address pass gates are configured to receive data from a bit-line pair of the memory cells in a row selected by an address signal. The pair of read pass gates is configured to connect a read bit-line pair to the bit-line pair in response to the first read enable signal being in a low-logic state. The first read enable signal is de-asserted after the read bit-line pair connected to the pair of read pass gates are pre-charged.

In another embodiment, the present disclosure provides a circuit, which includes a latch and a NAND gate. The latch is configured to receive a sense amplifier enable signal and a first sense amplifier pre-charge signal to generate a first output signal. The NAND gate is configured to receive the first output signal and a first read enable signal to generate a second read enable signal.

In yet another embodiment, the present disclosure provides a method for controlling a read operation in a memory device. The method includes providing a sense amplifier enable signal, a first sense amplifier pre-charge signal, and a latched write enable signal to a read-clock generation circuit to generate a first read enable signal, and providing the first read enable signal to a first read switch and a second read switch, wherein the first read enable signal is de-asserted after a read bit line connected to the first read switch and an inverse read bit line connected to the second read switch are pre-charged.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A memory device, comprising:
   a memory array, comprising a plurality of memory cells in a two-dimensional array;
   a read-clock generation circuit, configured to receive a sense amplifier enable signal, a first sense amplifier pre-charge signal, and a latched write enable signal to generate a first read enable signal;
   a local input/output circuit, comprising:
      a plurality of pairs of column-address pass gates, configured to receive data from a bit-line pair of the memory cells in a row selected by an address signal; and
      a pair of read pass gates, configured to connect a read bit-line pair to the bit-line pair in response to the first read enable signal being in a low-logic state;
   wherein the first read enable signal is de-asserted after the read bit-line pair connected to the pair of read pass gates are pre-charged.

2. The memory device of claim 1, wherein the first sense amplifier pre-charge signal and the first read enable signal are low-active signals.

3. The memory device of claim 2, wherein the pair of read pass gates is further connected to a sense amplifier through the read bit-line pair.

4. The memory device of claim 3, wherein the sense amplifier comprises:
   a sense amplifier pre-charging circuit, configured to pre-charge the read bit-line pair in response to the first sense amplifier pre-charge signal being in the low-logic state; and
   a sense amplifier circuit, configured to amplify a voltage difference between a read bit line and an inverse read bit line in the read bit-line pair to generate an output signal.

5. The memory device of claim 1, wherein the read-clock generation circuit comprises:
   a first inverter, configured to convert the latched write enable signal into a second read enable signal;
   a second inverter, configured to convert the first sense amplifier pre-charge signal to a second sense amplifier pre-charge signal;

a first NOR gate, configured to receive the second sense amplifier pre-charge signal and a second output signal to generate a first output signal;

a second NOR gate, configured to receive the sense amplifier enable signal and the first output signal to generate the second output signal; and a NAND gate, configured to receive the second output signal and the second read enable signal to generate the first read enable signal.

6. The memory device of claim 5, wherein the first NOR gate and the second NOR gate forms an RS latch.

7. The memory device of claim 6, wherein in a standby mode of the read-clock generation circuit, the sense amplifier enable signal and the first sense amplifier pre-charge signal are in the low-logic state when an internal clock signal of the memory device is in the low-logic state.

8. The memory device of claim 7, after a rising edge of the internal clock signal, the first sense amplifier pre-charge signal is changed to a high-logic state before the sense amplifier enable signal is changed to the high-logic state, wherein in response to the first sense amplifier pre-charge signal being changed to the high-logic state, the second output signal of the RS latch is kept in the high-logic state.

9. The memory device of claim 8, wherein in response to the sense amplifier enable signal being changed to the high-logic state, the second output signal of the RS latch is reset to the low-logic state, and the first read enable signal generated by the read-clock generation circuit is changed to the high-logic state.

10. The memory device of claim 9, wherein in response to the first read enable signal being changed to the high-logic state, the pair of read pass gates is turned off, and the sense amplifier amplify a voltage difference between a read bit line and an inverse read bit line in the read bit-line pair to generate an output signal.

11. The memory device of claim 1, wherein the local input/output circuit further comprises a bit-line pre-charging circuit that is controlled by a bit-line pre-charging signal.

12. The memory device of claim 11, wherein:

in response to the bit-line pre-charging signal being in the low-logic state, the bit-line pre-charging circuit is turned on to pre-charge a voltage of the bit-line pair to a power supply voltage of the memory device; and in response to the bit-line pre-charging signal being in a high-logic state, the bit-line pre-charging circuit is turned off.

13. A circuit, comprising a latch, configured to receive a sense amplifier enable signal and a first sense amplifier pre-charge signal to generate a first output signal; and a NAND gate, configured to receive the first output signal and a first read enable signal to generate a second read enable signal.

14. The circuit of claim 13, wherein further comprising:

a first inverter, configured to convert a latched write enable signal into the first read enable signal; and a second inverter, configured to convert a second sense amplifier pre-charge signal to the first sense amplifier pre-charge signal.

15. The circuit of claim 14, wherein the latch comprises and a first NOR gate and a second NOR gate, wherein a first input terminal of the first NOR gate receives the first sense amplifier pre-charge signal, and a second input terminal of the first NOR gate is connected to a second output terminal of the second NOR gate, and a first output terminal of the first NOR gate is connected to a first input terminal of the second NOR gate, wherein a second input terminal of the second NOR gate receives the sense amplifier enable signal, and the second output terminal of the second NOR gate outputs the first output signal.

16. The circuit of claim 15, wherein the second read enable signal is provided to a pair of read pass gates in a local input/output circuit of a memory device, and the pair of the read pass gates connects a read bit-line pair to a bit-line pair of a memory array of the memory device, wherein the second read enable signal is de-asserted after the read bit-line pair connected to the pair of read pass gates are pre-charged, wherein the memory device comprises a local control circuit, the local input/output circuit, and the memory array, wherein the local control circuit controls operations of the local input/output circuit to read data from or write data to the memory array.

17. The circuit of claim 16, wherein the circuit is disposed in the local control circuit.

18. The circuit of claim 16, wherein the circuit is disposed in the local input/output circuit.

19. A method for controlling a read operation in a memory device, the method comprising:

providing a sense amplifier enable signal, a first sense amplifier pre-charge signal, and a latched write enable signal to a read-clock generation circuit to generate a first read enable signal; and providing the first read enable signal to a first read switch and a second read switch, wherein the first read enable signal is de-asserted after a read bit line connected to the first read switch and an inverse read bit line connected to the second read switch are pre-charged.

20. The method of claim 19, wherein the first sense amplifier pre-charge signal and the first read enable signal are low-active signals.

* * * * *